US006744512B2

United States Patent
Takahashi

(10) Patent No.: US 6,744,512 B2
(45) Date of Patent: Jun. 1, 2004

(54) POSITION MEASURING APPARATUS AND EXPOSURE APPARATUS

(75) Inventor: Akira Takahashi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/231,159

(22) Filed: Aug. 30, 2002

(65) Prior Publication Data
US 2003/0048444 A1 Mar. 13, 2003

Related U.S. Application Data

(63) Continuation of application No. PCT/JP01/00910, filed on Feb. 9, 2001.

(30) Foreign Application Priority Data

Mar. 2, 2000 (JP) .......................................... 2000-057827

(51) Int. Cl.$^7$ ............................................. G01B 11/00
(52) U.S. Cl. ........................ 356/401; 356/620; 430/22; 355/43
(58) Field of Search ................................ 356/401, 400, 356/399, 614–620; 430/22, 5; 250/548; 355/43

(56) References Cited

U.S. PATENT DOCUMENTS

| | | | | |
|---|---|---|---|---|
| 4,679,942 A | * | 7/1987 | Suwa et al. | 356/401 |
| 5,464,715 A | * | 11/1995 | Nishi et al. | 430/22 |
| 5,473,410 A | * | 12/1995 | Nishi | 355/53 |
| 6,016,186 A | * | 1/2000 | Mizutani | 355/53 |
| 6,141,107 A | * | 10/2000 | Nishi et al. | 356/401 |
| 6,198,527 B1 | * | 3/2001 | Nishi | 355/53 |
| 6,333,786 B1 | * | 12/2001 | Uzawa et al. | 356/401 |
| 6,416,912 B1 | * | 7/2002 | Kobayashi et al. | 430/22 |

FOREIGN PATENT DOCUMENTS

| | | | |
|---|---|---|---|
| JP | 61-271831 | 12/1986 | |
| JP | A 61-271831 | 12/1986 | |
| JP | 10-106937 | 4/1998 | |
| JP | A 10-106937 | 4/1998 | |
| JP | 10-260010 | 9/1998 | |
| JP | A 10-260010 | 9/1998 | |
| JP | A 11-241907 | 9/1999 | |
| JP | A 2000-28321 | 1/2000 | |
| JP | 2000-028321 | * 1/2000 | G01B/11/00 |
| JP | 2000-164845 | 6/2000 | |
| JP | A 2000-164845 | 6/2000 | |

* cited by examiner

Primary Examiner—Frank G. Font
Assistant Examiner—Layla Lauchman
(74) Attorney, Agent, or Firm—Oliff & Berridge PLC

(57) ABSTRACT

An object of the invention is to provide a position measuring apparatus which can measure position information of a mark formed on an object with high accuracy, and an exposure apparatus which can perform exposure by performing alignment highly accurately, based on the highly accurate position information measured by the position measuring apparatus, and as a result, can realize fine processing. In order to achieve the object, the present invention is a position information measuring apparatus for measuring position information of an alignment mark, by converting an image Im1 of an alignment mark formed on an image pickup plane F1 of an image pickup device into image information, while scanning the image Im1 in a scanning direction SC1, and performing calculation processing with respect to the obtained image information, wherein the measuring direction D11 of the image Im1 of the alignment mark is set so as to be orthogonal to the scanning direction SC1.

20 Claims, 11 Drawing Sheets

POSITION MEASURING APPARATUS AND EXPOSURE APPARATUS

TECHNICAL FIELD

The present invention relates to a position measuring apparatus which measures position information of a mark formed on an object such as a wafer or glass plate, or a mask or reticle, in a manufacturing process of semiconductor devices, liquid crystal display devices or the like, and an exposure apparatus which carries out alignment of an object, using the position information of the mark obtained by the position measuring apparatus, to expose a pattern formed on the mask or the reticle onto the wafer or the glass plate.

BACKGROUND ART

In manufacturing of devices such as semiconductor devices or liquid crystal display devices, an exposure apparatus is used to repetitively perform projection and exposure of a fine pattern image formed on a photo-mask or a reticle (hereinafter generally referred to as a "reticle") onto a substrate such as a semiconductor wafer or a glass plate, to which a photosensitizer such as a photo resist has been applied. When projection exposure is to be performed, it is necessary to precisely align the position of the substrate and the position of a pattern image formed on the reticle. The exposure apparatus has an alignment device for performing this alignment. The alignment device comprises an alignment sensor for detecting the position of an alignment mark formed on the substrate, and a control system for performing alignment of the substrate based on the position of the alignment mark detected by the alignment sensor.

Since the surface condition (roughness level) of the substrate, being an object to be measured, changes in the manufacturing process of semiconductor devices or liquid crystal display devices, it is difficult to accurately detect the position of the substrate by one alignment sensor. Therefore, a different sensor is generally used according to the surface condition of the substrate. Main alignment sensors include an LSA (Laser Step Alignment) type, an FIA (Field Image Alignment) type, and an LIA (Laser Interferometric Alignment) type. The outline of these alignment sensors will be described below.

The LSA type alignment sensor is an alignment sensor which irradiates a laser beam onto an alignment mark formed on the substrate, and measures the position of the alignment mark, using the diffracted and scattered light, and has been heretofore widely used for semiconductor wafers in various manufacturing steps. The FIA type alignment sensor is one which performs position measurement by illuminating an alignment mark, using a light source having a wide wavelength bandwidth such as a halogen lamp, and performs image processing of the image of the alignment mark obtained by the illumination result, and is effective for measurement of asymmetric marks formed on an aluminum layer or on the surface of a substrate. The LIA type alignment sensor is one which irradiates laser beams having a slightly different wavelength from two directions, makes the two diffracted light generated as a result thereof interfere with each other, and detects the position information of the alignment mark from the phase of the interfered light. This LIA type alignment sensor is effective, when used for alignment marks having a low difference in level, or a substrate having a large surface roughness.

The position information detector includes a TTL (Through The Lens) type which detects the position information of a mark on a substrate via a projection optical system, an off-axis type which directly detects the position information of a mark on a substrate, without using the projection optical system, and a TTR (Through The Reticle) type which observes a substrate and a reticle at the same time via the projection optical system, and detects the relative position thereof. When alignment of the reticle and the substrate is performed by using these position information detectors, a baseline quantity, which is a spacing between the measurement center of the position information detector and the center (exposure center) of the projected image of a pattern on the reticle, is determined in advance. Then the amount of misalignment of the mark from the measurement center is detected by the position information detector, and the substrate is shifted by a distance obtained by correcting this amount of misalignment by the baseline quantity, to thereby accurately align the center of a section area (shot area) set on the substrate with the exposure center. The shot area is then exposed by the exposure light. The baseline quantity may change gradually in the process of holding and using the exposure apparatus. If a so-called baseline change, being a change in the baseline quantity, occurs, the alignment accuracy (superposition accuracy) decreases. Therefore, it is necessary to regularly carry out a baseline check for accurately measuring the spacing between the measurement center of the position information detector and the exposure center.

One example of the overall operation of the exposure apparatus will be outlined below.

Before a substrate is carried to the exposure apparatus, the position information of a mark formed on a reticle is detected by a reticle position information detector, and position adjustment of the reticle is performed based on the position information. The substrate is then carried to the exposure apparatus, and the position information of a mark formed on the substrate is detected by a substrate position information detector. The substrate is then shifted by a distance obtained by correcting the amount of misalignment indicated by the position information of the substrate by the baseline quantity, within a plane perpendicular to the optical axis of the exposure light, based on the position information of the mark formed on the substrate, to thereby align the relative positions of the reticle and the shot area formed on the substrate. After this, and the exposure light is irradiated onto the reticle, to expose on the substrate the image of a pattern formed on the reticle.

Incidentally, the mark formed on the substrate is, for example, as shown in FIG. 12. FIG. 12 is a diagram showing one example of a mark formed on the substrate for position measurement. In FIG. 12, a mark 100 is one where rectangular mark elements 101 having a longitudinal direction are arranged substantially parallel in the longitudinal direction of each mark element 101, with a predetermined interval, for example, several $\mu$ms, in a direction orthogonal to the longitudinal direction. Therefore, the mark 100 shown in FIG. 12 has a construction such that the surface position changes periodically with respect to the direction orthogonal to the longitudinal direction of the mark elements 101, that is, in the direction indicated by reference symbol 102 in the figure.

The alignment sensor detects periodical changes of the surface position to measure the position information of the mark 100. For example, the FIA type alignment sensor detects an edge position of the mark elements 101, by performing image processing with respect to image information in which a signal strength (brightness of the image) changes according to the periodic change of the surface position, and measures the position information of the mark 100 (for example, position information indicating the central position of the mark 100), based on the detected edge position. When the position information of the mark 100 is to be measured by performing image processing, if image information having a sufficient strength cannot be obtained, the position information cannot be measured with high accuracy. Therefore, amplification is carried out by an AGC (Automatic Gain Control) circuit or the like, and it is set such that the strength of the image information so as to become a strength within a certain range.

Measurement processing of the position information by the FIA type alignment sensor will be described in detail below. FIG. 13 is a diagram for explaining the position information measurement processing by the FIA type alignment sensor. The FIA type alignment sensor includes an image pickup device constituted by arranging a plurality of pixels 103 on an image plane, that is, on an image pickup plane 104 of a mark image. As the image pickup device, for example, a CCD (Charge Coupled Device) is used. In FIG. 13, for easy understanding, there is shown the situation where images 110, 111 and 112 of three mark elements, of the mark elements 103 shown in FIG. 12, are formed on the image pickup plane 104. The pixels arranged on the image pickup plane 104 are for receiving the incident light and converting it into an electric signal. The image pickup device converts an image entering into the image pickup plane into image information, by sequentially scanning the arranged pixels.

That is to say, as shown in FIG. 13, pixels arranged in row r1 are sequentially scanned in the scanning direction indicated by reference symbol 105 in the figure. When scanning is finished for all elements arranged in row r1, pixels in the direction orthogonal to the scanning direction 105 indicated by reference symbol 106 in the figure and arranged in row r2, are sequentially scanned in the scanning direction 105, and in this manner, pixels arranged in row r3, r4, . . . are sequentially scanned. Of the image information obtained by scanning in this manner, the image information obtained by scanning row r1 is output as image information C1, and the image information obtained by scanning row r2 is output as image information C2. Image information is similarly output for the other rows. In FIG. 13, for easy understanding, the number of pixels arranged on the image pickup plane is shown decreased.

Generally, when the position information of the mark 100 is to be measured, the longitudinal direction of the mark elements 101 forming the mark 100 is set so as to be orthogonal to the scanning direction of the image pickup device. Incidentally, even if the strength of the image information detected by the image pickup device changes for each mark, the strength of the image information is stabilized and set to a value within a certain range, by providing the above-described AGC circuit. However, the image information of the mark is amplified at an amplification factor which is different for each mark, and as a result, misalignment error occurs in the measured position information. Next an explanation is given for the reason why misalignment errors occur due to the difference of the amplification factor for the AGC circuit.

FIG. 14 is a diagram showing an example of results of amplifying the image information, obtained by converting the images 110, 111 and 112 of the mark elements shown in FIG. 13 by the image pickup device, at a differ amplification factor. In FIG. 14, curves denoted by reference symbols d1, d2 and d3 show a part of the image information obtained by amplifying the image information at different amplification factors, respectively. The set amplification factors increase in order of the curves d1, d2 and d3. The image information shown in FIG. 14 indicates the image information obtained by using the above described image pickup device, which performs scanning processing timewise, wherein time is plotted on the X axis and the signal strength is plotted on the Y axis. In FIG. 14, three X axes are shown, and the points in time when the lines set parallel with the Y axis intersect each X axis are the same points in time.

As is seen from FIG. 14, the detection signal obtained by amplifying the signal at a different amplification factor is delayed timewise. This is because the frequency characteristic of the amplifying circuit including the AGC circuit deteriorates with respect to high frequency components. That is to say, when Fourier transformation is applied to the detection signal shown in FIG. 14, this can be separated into each frequency component. Since the amplifying circuit has generally a small gain with respect to high frequency components, low frequency components can be amplified by a set amplification factor, but high frequency components are not amplified at the amplification factor set with respect to the low frequency components.

Thus, when frequency components amplified at a different amplification factor are combined, the signal waveform becomes dull, as shown by curves d2 and d3 in FIG. 14. This tendency generally becomes conspicuous, as the amplification factor set with respect to the detection signal becomes high. As shown in FIG. 14, when the detection signal is set on the time base, the position information of the mark is measured, based on the position of the detection signal on the time base, for example, based on the position on the time base of a maximal part and a minimal part. Therefore, as shown in FIG. 14, en the amplification factor is different, the detection signal becomes dull, and as a result, the position of the detection signal on the time base changes. The change quantity of the position of the detection signal on the time base also changes, when the amplification factor is different.

As shown in FIG. 13, the image pickup device performs scanning of the arranged elements to obtain image information. However, since scanning is a processing for obtaining image information of pixels arranged at positions different in a time series, the image information obtained by scanning is a signal that changes with time. Moreover, the mark 100 shown in FIG. 12 is for measuring position information indicated by reference symbol 102 in FIG. 12. As described above, when the position information of the mark 100 is to be measured, the longitudinal direction of the mark elements 101 forming the mark 100 is set so as to be orthogonal to the scanning direction of the image pickup device. That is to say, when the amplification factor is changed and the signal waveform of the image information becomes dull, the position of the mark 100 on the time base becomes a position delayed timewise, and as a result, the measured position information is deviated from the original position of the mark 100. Further, with a change of the amplification factor, the amount of misalignment also changes.

It is considered that there is no problem if the amount of misalignment of the mark is not larger than the resolving power required at the time of alignment. Therefore, it has also been considered to improve the AGC circuit and to design the AGC circuit so that the misalignment hardly occurs, or the amount of misalignment is not larger than the resolving power required at the time of alignment, However, when the size of the visual field of the position measuring apparatus is about 200 $\mu$m×160 $\mu$m, and the number of pixels of the image pickup device is 640×480 pixels, one pixel corresponds to a distance of about 0.3 $\mu$m on the substrate. The resolving power generally required at the time of alignment is about 10 nm, and hence this distance is about 1/30 of the above one pixel. If the distance of 10 nm is converted into the time interval in the image information, it corresponds to about 3 ns, which is a very short time as a delay for the electric signal. Accordingly, it is very difficult to design an AGC circuit in which misalignment does not occur, by improving the frequency characteristic.

Recently, higher densities are required in integrated circuits. For example, in a CPU (central control unit) used in personal computers, line widths of 0.18 μm are being put to practical use, but in the near future, there is proposed a plan to make the line width 0.1 μm. Therefore, it is considered that fine processing techniques with higher densities will be required in the future. In order to respond to such high density requirement, it becomes very important to reduce the measurement error in the position information to as small as possible, and to improve alignment accuracy by performing alignment based on position information measured with high accuracy.

DISCLOSURE OF INVENTION

In view of the above situation, it is an object of the present invention to provide a position measuring apparatus which can measure the position information of a mark formed on an object with high accuracy, and an exposure apparatus which can perform exposure by performing alignment highly accurately, based on the highly accurate position information measured by the position measuring apparatus, and as a result, can realize fine processing.

In order to solve the above problems, the position measuring apparatus of the present invention is a position measuring apparatus (14, 18) which measures position information in a predetermined direction (D1, D2, D3) of a mark (AM, AM1) formed on an object (W), which comprises: an irradiation device (15, 16, 20, 21, 24, 25, 26, 27, 28) which irradiates a detection beam (IL2) onto the mark (AM, AM1); an imaging optical system (28, 27, 26, 25, 29, 30, 31, 50) which forms an image (Im1, Im2) of the mark generated from the mark (AM, AM1) due to the irradiation of the detection beam (IL2), on an image plane (F1, F2, F3); an image pickup device (32, 51) which picks up the image (Im1, Im2) of the mark on the image plane (F1, F2, F3), while scanning scanning lines, to generate image information corresponding to the image (Im1, Im2) of the mark; and a calculation device (41) which obtains position information in the predetermined direction (D1, D2, D3) of the mark (AM, AM1), based on the image information, wherein the scanning direction (SC1, SC2, SC3) of the scanning lines is orthogonal to the predetermined direction (D1, D2, D3).

According to this invention, since the predetermined direction of the mark is set so as to be orthogonal to the scanning direction of the scanning lines, even if the image information is amplified, a time lag in the measuring direction does not occur as in the conventional technique, and hence misalignment attributable to the time lag does not occur. As a result, position information of the mark can be measured with high accuracy.

Preferably the position measuring apparatus of the present invention further comprises a memory device (40, 60) which stores the image information, and the calculation device (41) calculates image information of the mark (AM, AM1), based on the image information stored in the memory device (40, 60).

In the position measuring apparatus of the present invention, the image pickup device (32, 51) may be rotatable with respect to the image (Im1) of the mark, so that the direction (SC1) of the scanning lines is orthogonal to the predetermined direction (D1).

In the position measuring apparatus of the present invention, the mark (AM1) may include a first mark ($AM_Y$) having periodicity in a first direction (D3), and a second mark ($AM_X$) having periodicity in a second direction (D2) orthogonal to the first direction (D3), and the image pickup device (32, 51) may include a first image pickup device (32) comprising scanning lines extending in a direction orthogonal to the first direction (D3), and a second image pickup device (51) comprising scanning lines extending in a direction orthogonal to the second direction (D2).

In the position measuring apparatus of the present invention, the calculation device (41) may obtain position information of the first mark ($AM_Y$) in the first direction (D3), based on the image information obtained by the first image pickup device (32), and may obtain position information of the second mark ($AM_X$) in the second direction (D2), based on the image information obtained by the second image pickup device (51).

The position measuring apparatus of the present invention may have; a branching device (50) which branches the image (Im2) of the mark to an image ($Im_Y$) of the first mark and an image ($Im_X$) of the second mark, and guides the image ($Im_Y$) of the first mark to the first image pickup device (32), and guides the image ($Im_X$) of the second mark to the second image pickup device (51), a first memory device (40) which stores the image information obtained from the first image pickup device (32), and a second memory device (60) which stores the image information obtained from the second image pickup device (51).

The position measuring apparatus of the present invention is a position measuring apparatus which measures position information in a predetermined direction (the direction of the X axis) of a mark (AM, AM1) formed on an object (W), comprising: an irradiation device (15, 16, 20, 21, 24, 25, 26, 27, 28) which irradiates a detection beam (IL2) onto the mark (AM, AM1); an imaging optical system (28, 27, 26, 25, 29, 30, 31, 50) which forms an image of the mark generated from the mark (AM, AM1) due to the irradiation of the detection beam (IL2), on an image plane (104); an image pickup device (32, 51) which picks up the image of the mark on the image plane (104), while scanning scanning lines, to generate image information corresponding to the image of the mark; and a calculation device (41) which obtains position information in the predetermined direction (the direction of X axis) of the mark (AM, AM1), based on the image information, wherein the image pickup device (32, 51) picks up the image of the mark, while scanning the scanning lines in the predetermined direction (the direction of the X axis) with respect to the image of the mark, to generate first image information and picks up the image of the mark, while scanning the scanning lines in a direction (the direction of the −Y axis) opposite to the predetermined direction (the direction of the X axis) with respect to the image of the mark, to generate second image information, and the calculation device (41) obtains the image information based on the first and second image information.

In the position mea apparatus of the present invention, the image pickup device (32, 51) may be rotatable with respect to the image of the mark.

Moreover, in the position measuring apparatus of the present invention, the image pickup device (32, 51) may include a plurality of scanning lines, of which a first scanning line picks up the image of the mark, while scanning in the predetermined direction (the direction of the X axis) with respect to the image of the mark, and a second scanning line different from the first scanning line picks up the image of the mark, while scanning in the opposite direction (the direction of the −X axis) with respect to the image of the mark.

Furthermore, an exposure apparatus of the present invention has an alignment device (9, 12) which adjusts the position of a substrate (W), based on the position information of a mark (AM, AM1) on the substrate (W), measured by the above described position measuring apparatus, wherein the aligned substrate (W) is exposed with a predetermined pattern.

According to the exposure apparatus of the present invention, alignment of the substrate is performed based on position information detected with high accuracy. Therefore, when exposure is performed repeatedly on a pattern already formed on the substrate, highly accurate superposition is possible, and as a result, fine processing can be realized.

BEST MODE FOR CARRYING OUT THE INVENTION

The position measuring apparatus and the exposure apparatus according to one embodiment of the present invention will be described in detail, with reference to the drawings.

Figure 1:
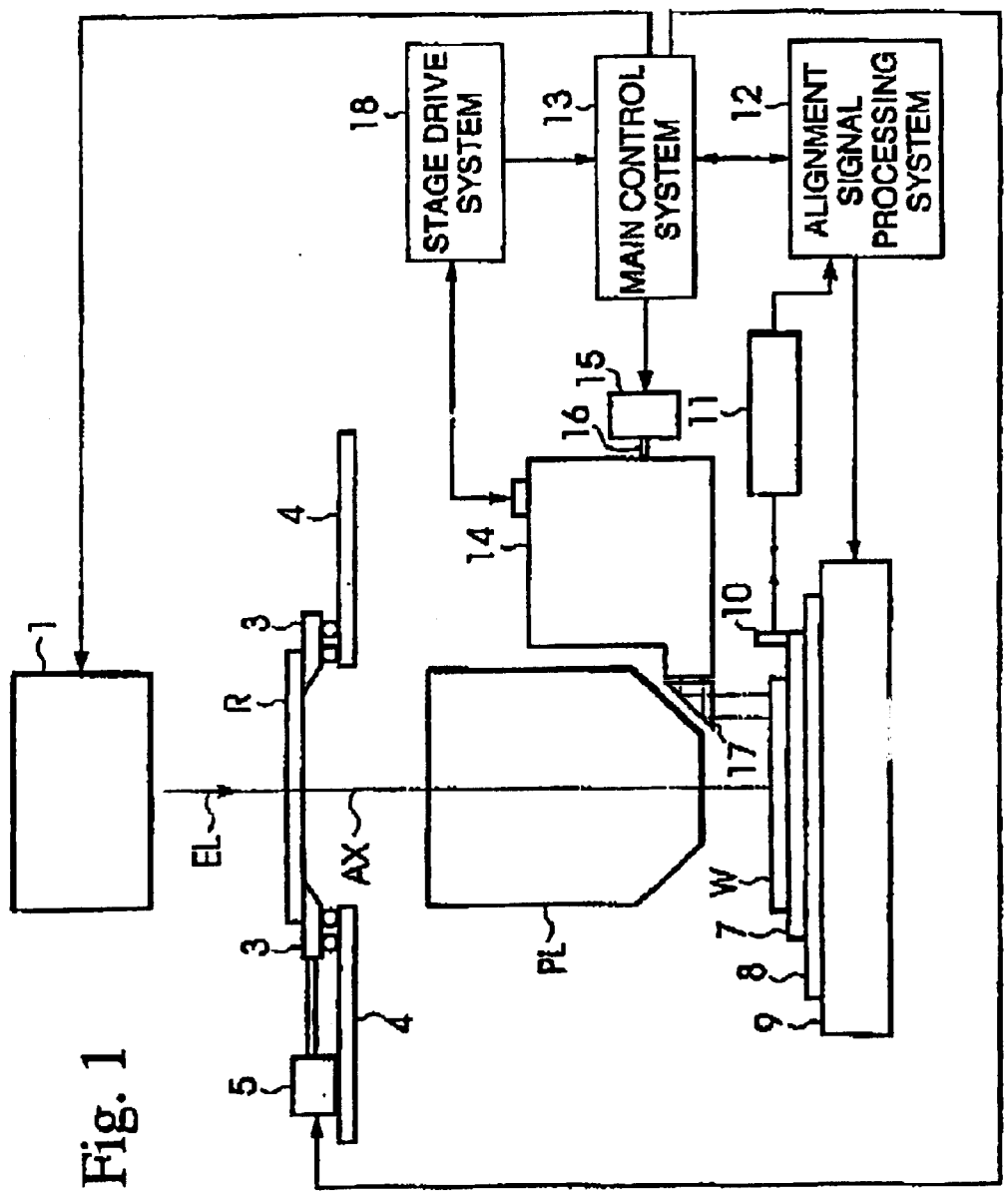
FIG. 1 is a diagram showing a schematic construction of an exposure apparatus according to one embodiment of the present invention.

FIG. 1 is a diagram showing the schematic construction of the exposure apparatus according to the one embodiment of the present invention. In this embodiment, the present invention is applied to a step and repeat type exposure apparatus having an off-axis type alignment sensor. In the description below, the XYZ rectangular coordinate system shown in FIG. 1 is established, and the positions of each member are described with reference to this XYZ rectangular coordinate system. In the XYZ rectangular coordinate system, the X axis and the Z axis are set parallel with the paper face, and the Y axis is set vertical to the paper face. In the XYZ coordinate system in the figure, actually, the XY plane is set on a plane parallel with the horizontal plane, and the Z axis is set in the perpendicularly upward direction.

In FIG. 1, when a control signal indicating emission of exposure light is output from a main control system 13 described later, an illumination optical system 1 emits exposure light EL having substantially uniform illuminance to irradiate a reticle R. The optical axis of the exposure light EL is set to be parallel with the direction of the Z axis. As the exposure light EL, there can be used, for example, a g line ((436 nm), an i line (365 nm), a KrF excimer laser beam (248 nm), an ArF excimer laser beam (193 nm) or an $F_2$ excimer laser beam (157 nm).

The reticle R has a fine pattern to be transferred onto a wafer (substrate) W to which a photoresist has been applied, and is held on a reticle holder 3. The reticle holder 3 is supported so as to be able to move and rotate slightly within the XY plane on a base 4. The main control system 113 for controlling the operation of the whole apparatus controls the operation of the reticle stage 3 via a drive 5 on the base 4, to thereby set the position of the reticle R.

When the exposure light EL is emitted from the illumination optical system 1, a pattern image of the reticle R is projected to each shot area on the wafer W, via a projection optical system PL. The projection optical system PL has an optical device such as a plurality of lenses, and the glass material of the optical device is selected from optical materials such as quartz and fluorite, according to the wavelength of the exposure light EL. The wafer W is mounted on a Z stage 8 via a wafer holder 7. The Z stage 8 is a stage for finely adjusting the position of the wafer W in the direction of the Z axis. The Z stage 8 is mounted on an XY stage 9. The XY stage 9 is a stage for moving the wafer W in the XY plane. Though not shown, preferably there is provided a stage for slightly rotating the wafer W in the XY plane, and a stage for adjust the inclination of the wafer W with respect to the XY plane, by changing the angle with respect to the Z axis.

An L-shape movable mirror 10 is fitted at one end of the wafer holder 7 on the upper surface thereof, and a laser interferometer 11 is arranged at a position facing the mirror surface of the movable mirror 10. Though the illusion is simplified in FIG. 1, the movable mirror 10 comprises a plane mirror having a surface of the mirror perpendicular to the X axis and a plane mirror having a surface of the mirror perpendicular to the Y axis. The laser interferometer 11 comprises two laser interferometers for the X axis which irradiate laser beams to the movable mirror 11 along the X axis, and a laser interferometer for the Y axis which irradiates a laser beam onto the movable mirror 11 along the Y axis. The X coordinate and the Y coordinate of the wafer stage 7 are measured by one laser interferometer for X axis and one laser interferometer for Y axis.

The angle of rotation in the XY plane of the wafer holder 7 is measured by a difference in the measurement values of the two laser interferometers for the X axis. The information relating to the X coordinate, the Y coordinate and the angle of rotation measured by the laser interferometer 11 is supplied to a stage drive system 12. The information is output from the stage drive system 12 to the main control system 13 as the position information. The main control system 13 controls the positioning operation of the wafer holder 7 via the stage drive system 12, while monitoring the supplied position information. Though not shown in FIG. 1, the reticle holder 3 is also provided with the same movable mirror and laser interferometer as those provided on the wafer holder 7, and information such as the XYZ position of the reticle holder 3 is input to the main control system 13.

An off-axis alignment sensor 14 is provided on the side of the projection optical system PL. This alignment sensor 14 forms a part of a position measuring apparatus according to one embodiment of the present invention, which is provided in the exposure apparatus according to the one embodiment of the present invention, and is a position measuring apparatus when applied to the FIA (Field Image Alignment) type. Illumination light for illuminating the wafer W is shone to the alignment sensor 14 from a halogen lamp 15 through an optical fiber 16. The reason why the halogen lamp 15 is used as the light source of the illumination light is because the wavelength region of the outgoing beam of the halogen lamp 15 is from 500 to 800 nm, being a wavelength region that does not expose the photoresist applied on the upper surface of the wafer W, and because the wavelength band is wide, so that the influence of reflectivity with respect to the wavelength characteristic on the surface of the wafer W can be reduced.

The illumination light emitted from the alignment sensor 14 is reflected by a prism mirror 17, to irradiate the upper surface of the wafer W. The alignment sensor 14 gathers the reflected light from the upper surface of the wafer W via the prism mirror 17, converts the detection result into an electric signal, and outputs the electric signal as image information to an alignment signal processing system 18. A defocus signal indicating the amount of misalignment (the amount of defocus) of the wafer W with respect to the focal position of the alignment sensor 14 is also output from the alignment sensor 14 to the alignment signal processing system 18. The alignment signal processing system 18 obtains the position of an alignment mark AM in the XY plane, and the amount of misalignment (the amount of defocus) of the wafer W with respect to the focal position of the alignment sensor 14, based on the image information and the defocus signal from the alignment sensor 14, and outputs these to the main control system 13 as the position information of the wafer.

The main control system 13 controls the whole operation of the exposure apparatus, based on the position information output from the stage drive system 12, and the position information of the wafer output from the alignment signal processing system 18. More specifically, the main control unit 13 outputs a drive control signal to the stage drive system 12, based on the position information of the wafer output from the alignment signal processing system 18. The stage drive system 12 performs stepping drive of the XY stage 9 and the Z stage 8. At this time, the main control system 13 first outputs a drive control signal to the stage drive system 12, so that the position of a reference mark (not shown) formed on the wafer W is detected by a position detection sensor (not shown). When the stage drive system 12 drives the XY stage 9, image information and a defocus signal are output from the alignment sensor 14 to the alignment signal processing system 18. From this detection result, for example, a baseline quantity is measured, which is for example, an amount of misalignment between the detection center of the position detection sensor and the center of a projected image on the reticle R (the optical axis AX of the projection optical system PL). The X coordinate and the Y coordinate of the wafer W are then controlled based on a value obtained by adding the baseline quantity to the position of the alignment mark AM measured by the position detection sensor, to thereby accurately match each shot area with the exposure position. After matching the shot area with the exposure position, the main control system 13 outputs a control signal, which instructs the illumination optical system 1 to emit the exposure light EL.

Figure 2:
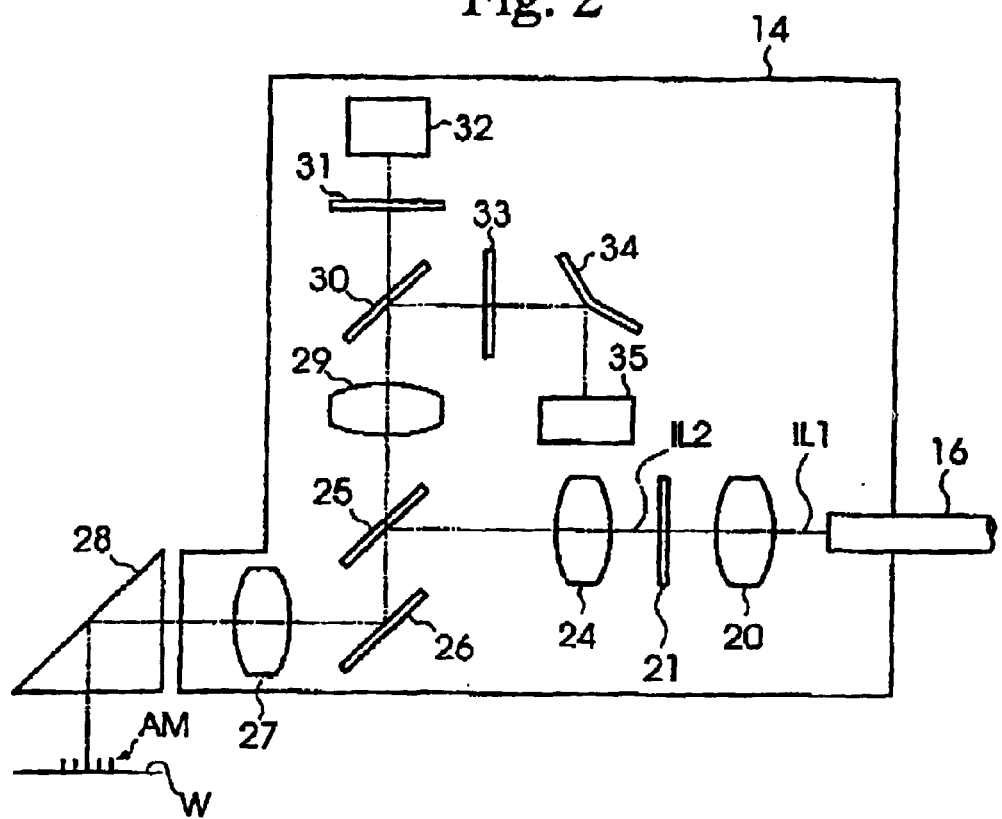
FIG. 2 is a diagram showing the construction of an alignment sensor 14 provided in a position measuring apparatus according to the one embodiment of the present invention.

The construction of the exposure apparatus and the outline of the operation thereof according to the one embodiment of the present invention have been described above. The alignment sensor 14 provided in the position measuring apparatus according to the one embodiment of the present invention, will be described below in detail. FIG. 2 is a diagram showing the construction of the alignment sensor 14 provided in the position measuring apparatus according to the one embodiment of the present invention. In FIG. 2, the same members as those shown in FIG. 1 are denoted by the same reference symbols. As shown in FIG. 2, illumination light IL1 having a wavelength region of from 500 to 800 nm is guided to the alignment sensor 14 from the halogen lamp 15 in FIG. 1, via the optical fiber 16.

Figure 3A:
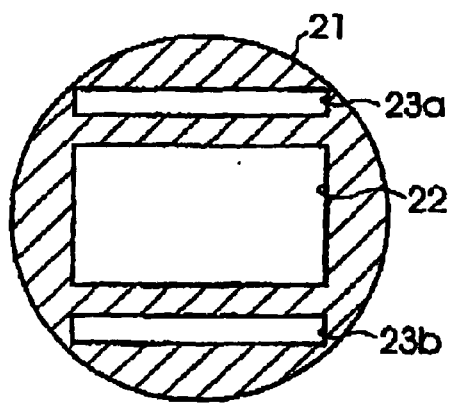
FIG. 3A is a cross section showing one example of a field dividing stop 103.

This illumination light IL1 enters into a field dividing stop 21 via a condenser lens 20. The field dividing stop 21 is for restricting the shape of the image of the illumination light IL1 irradiated onto the wafer W. FIG. 3A is a cross-section showing one example of the field dividing stop 103. As shown in this figure, in the field dividing stop 21, there are formed a mark illumination stop 22 comprising a wide rectangular opening at the center thereof, and slits 23a and 23b for detecting the focus, comprising a pair of narrow rectangular openings arranged on either side of the mark illumination stop 22.

Figure 4:
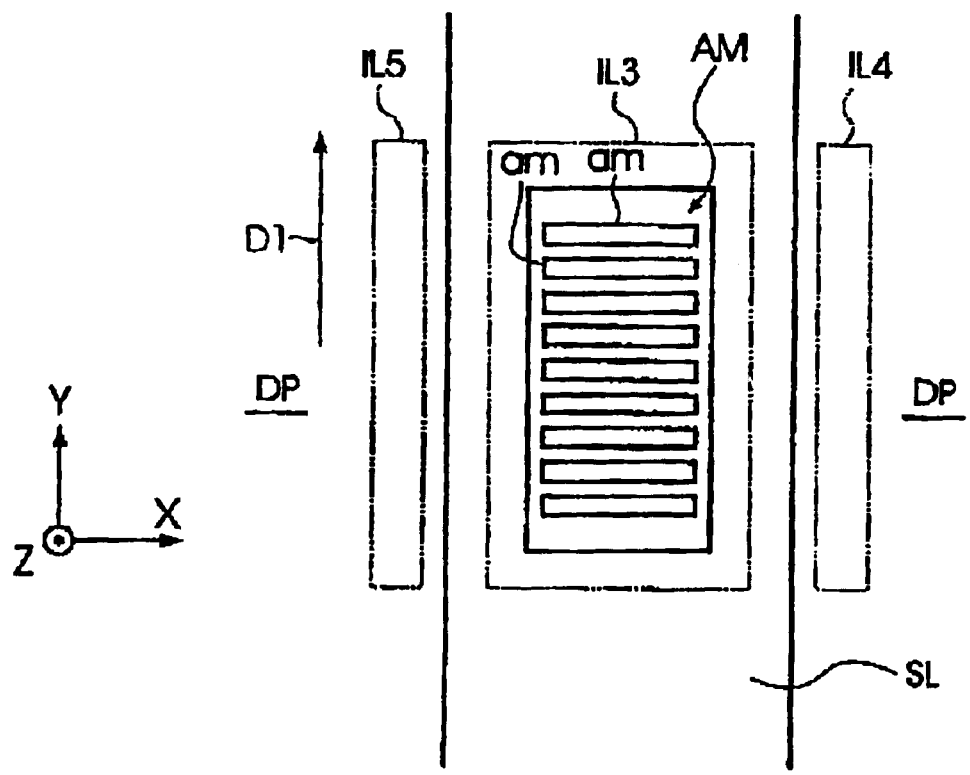
FIG. 4 is a diagram for explaining an illumination area on a wafer W, of the alignment sensor 14.

The illumination light IL1 is divided by the field dividing stop 21 into a first light flux for illuminating the ark that illuminates the alignment mark area on the wafer W, and a second light flux for detecting the focal position prior to alignment. The field-divided illumination tight IL2 passes through the lens system 24, and is reflected by a half mirror 25 and a mirror 26, and further reflected by a prism mirror 28 via an object lens 27, and then irradiated on the mark area including the alignment mark AM formed in a street line SL on the wafer W, and the vicinity thereof, as shown in FIG. 4. FIG. 4 is a diagram for explaining the illumination area of the alignment sensor 14 on the wafer W.

As shown in FIG. 4, the alignment mark AM is formed on the street line (scribe line) SL provided between device portions DP. In this embodiment, the alignment mark AM shown in FIG. 4 is assumed as the alignment mark. That is to say, the alignment mark AM is obtained by arranging, in the Y-axis direction in the figure, rectangular mark elements am, am, . . . having a longitudinal direction in the X-axis direction in the figure This alignment stark AM is for measuring the position information in the Y-axis direction, with the surface position thereof being in a direction which changes periodically in the Y-axis direction. Hereunder the alignment mark AM is as shown in FIG. 4. When arranged as shown in the figure, the direction denoted by reference symbol D1 in FIG. 4, that is, the direction parallel with the Y axis is referred to as a measuring direction.

The illumination light IL2 is illuminated on the alignment mark AM as shown in the figure. That is to say, the first light flux obtained by being shaped by the mark illumination stop 22 formed in the field dividing stop 21 illuminates the alignment mark AM as illumination light IL3, and illumination lights IL4 and IL5 obtained by being shaped by the slits 23a and 23b for detecting the focal point, respectively illuminate on the device portions DP.

The reflected light from the exposure surface of the wafer W, when illuminated by the illumination light IL2, is reflected by the prism mirror 28, and further reflected by the mirror 26, after having passed through the object lens 27, and then passes through the half mirror 25. Thereafter, the reflected light reaches a beam splitter 30 via a lens system 29, and is branched to two directions. A first branched light having passed through the beam splitter 30 forms an image of the alignment mark AM on an index plate 31. This image and the light from an index mark on the index plate 31 enter into an image pickup device 32 comprising a two-dimensional CCD, and hence images of the alignment mark AM and the index mark are formed on an image pickup plane of the image pickup device 32.

Figure 5:
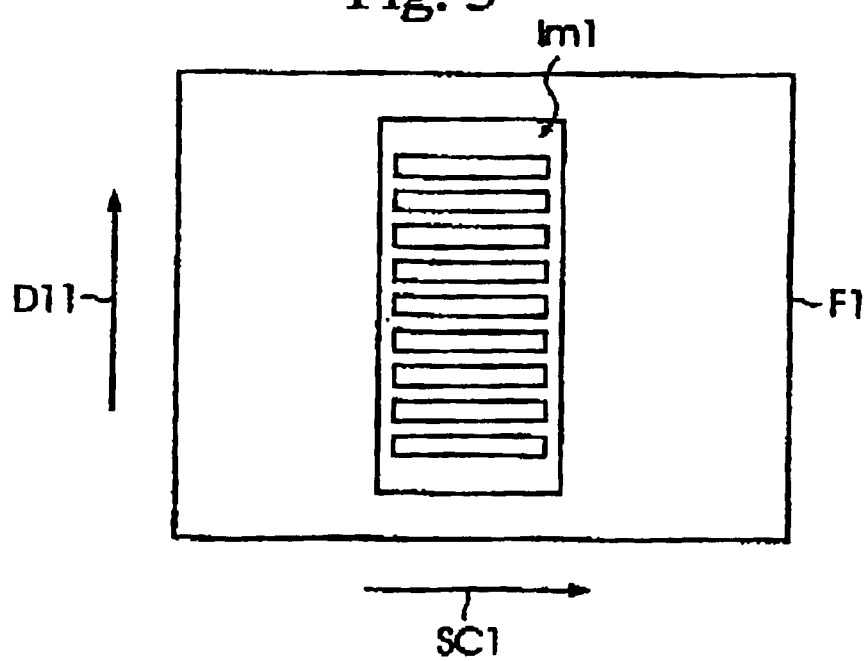
FIG. 5 is a diagram showing the arrangement on an image pickup plane F1 of an image pickup device 32 with respect to an image of an alignment mark AM.

The arrangement of the image pickup plane of the image pickup device 32 with respect to the image of the alignment mark AM will be described below. FIG. 5 is a diagram showing the arrangement of the image pickup plane F1 of the image pickup device 32 with respect to the image of the alignment mark AM. Of the images formed on the image pickup plane F1 of the image pickup device 32, only the image of the alignment mark AM is shown in FIG. 5. In FIG. 5, reference symbol Im1 denotes the image of the alignment mark AM formed on the image pickup plane of the image pickup device 32. The image pickup device 32 is set such that the scanning direction SC1 thereof is orthogonal to the measuring direction D11 of the alignment sensor AM. The measuring direction D11 shown in FIG. 5 is a direction corresponding to the measuring direction D1 shown in FIG. 4. That is to say, the measuring direction D11 is the direction in which the strength of the image of the alignment mark AM changes periodically. By arranging the image pickup device 32 in this manner, the scanning direction of the image pickup device 32 and the longitudinal direction of the images of mark elements am, . . . , which form the alignment mark AM, are set to be substantially parallel with each other.

The image pickup device 32 is constructed so as to be rotatable in the image pickup plane F1, and the rotation operation thereof is performed by an actuator (not shown), under control of the alignment signal processing system 18. By rotating the image pickup device 32, the scanning direction SC1 of the image pickup device 32 can be changed. The alignment mark AM shown in FIG. 4 is a mark for measuring the position information in the Y-axis direction. An alignment mark for measuring the position in the X-axis direction is one where the alignment mark AM shown in FIG. 4 is rotated by 90 degrees. That is to say, the alignment mark for measuring the position in the X-axis direction is such that the surface position changes periodically in the X-axis direction. When this alignment mark is measured, the image formed on tee image pickup plane F1 of the image pickup device 32 is one where the image Im1 is rotated by 90 degrees, in the image pickup plane F1 shown in FIG. 5. In this case, since the scanning direction SC1 of the image pickup device 32 coincides with the measuring direction, the image pickup device is rotated by 90 degrees, in order to make the scanning direction SC1 of the image pickup device 32 orthogonal to the measuring direction.

Figure 3B:
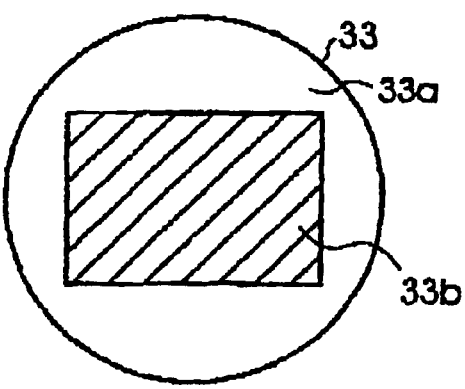
FIG. 3B is a diagram showing one example of a shielding plate 33.

On the other hand, the second branched light reflected by the beam splitter 30 enters into a shielding plate 33. FIG. 3B is a diagram showing one example of the shielding plate 33. The shielding plate 33 shown in FIG. 3B shields the light entering into a rectangular area denoted by reference symbol 33a, and transmits the light entering into an area 33b other than the rectangular area 33a. Therefore, the shielding plate 33 shields the branched light corresponding to the first light flux described above, and transmits the branched light corresponding to the second light flux. The branched light having passed through the shielding plate 33 enters into a line sensor 35 comprising a one-dimensional CCD, with the telecentric property being destroyed by a pupil dividing mirror 34, and images of the slits 23a and 23b for detecting the focal point are formed on a light-receiving surface of the line sensor 35.

Since the telecentric property is ensured between the wafer W and the image pickup device 32, when the wafer W is displaced in the direction parallel with the optical axes of the illumination light and the reflected light, the image of the alignment mark AM formed on the image pickup plane of the image pickup device 32 is defocused without changing the position on the image pickup plane of the image pickup device 32. On the other hand, in the reflected light entering into the line sensor 35, since the telecentric property thereof is destroyed as described above, when the wafer W is displaced in the direction parallel with the optical axes of the illumination light and the reflected light, the images of the slits 23a and 23b for detecting the focal point, formed on the light-receiving surface of the line sensor 35 misalign in a direction orthogonal to the optical axis of the branched light. If the misalignment of the image on the line sensor 35 with respect to the reference position is measured by utilizing such a property, the position (focal position) of the wafer W in the direction of the optical axis of the illumination light and the reflected light can be detected.

Figure 6:
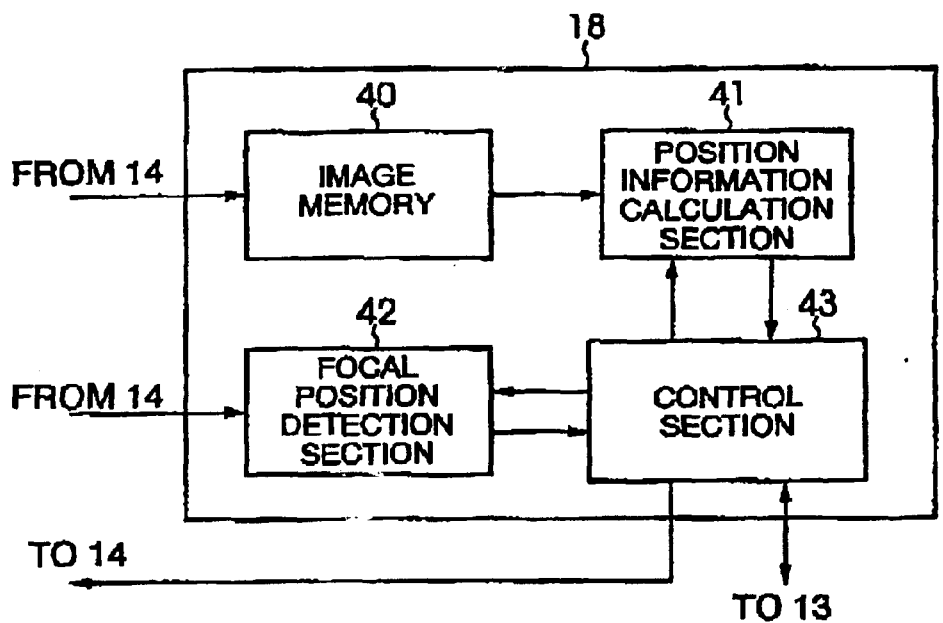
FIG. 6 is a block diagram showing an outline of the internal structure of an alignment signal processing system 18.

Next is a description of an outline of the internal structure of the alignment signal processing system 18. FIG. 6 is a block diagram showing the outline of the internal structure of the alignment signal processing system 18. As shown in FIG. 6, the alignment signal processing system 18 has an image memory 40, a position information calculation section 41, a focal position detection section 42 and a control section 43. The image memory 40 temporarily stores the image information output from the alignment sensor 14. Though not shown, there is provided an AGC circuit and an analog to digital converter (hereinafter referred to as "A/D converter") in the previous stage of the image memory 40. The image information output from the alignment sensor 14 is amplified by the AGC circuit, and then digitized by the A/D converter. Therefore, digitized image information is stored in the image memory 40.

The position information calculation section 41 performs calculation processing on the image information stored in the image memory 40, to measure the position information of the alignment mark AM. The focal position detection section 42 detects the amount of defocus of the wafer W with respect to the focal position of the alignment sensor 14, based on the defocus signal output from the alignment sensor 14. The control section 43 controls the position information calculation section 41 and the focal position detection section 42, as well as outputting the position information of the alignment mark AM obtained by the position information calculation section 41, and the amount of defocus detected by the focal point detection section 42 to the main control section 13, as the position information of the wafer.

Next is a description of the position detection operation using the alignment sensor 14 of the exposure apparatus in this embodiment.

When the processing is started, the main control system 13 drives the XY stage 9 via the stage drive system 12, so that the alignment mark AM for measuring the position in the Y-axis direction on the wafer W moves to a position within the area of visual field of the alignment sensor 14. When this shift of the alignment mark AM has been completed, the main control system 13 outputs a control signal to the alignment signal processing system 18, and the alignment signal processing system 18 rotates the image pickup device 32 based on this control signal. That is to say, since the alignment mark AM to be measured is for measuring the position information in the Y-axis direction, the alignment signal processing system 18 outputs a drive signal to the actuator (not shown), so that the scanning direction of the image pickup device 32 becomes orthogonal to the measuring direction of the alignment mark AM.

The main control system 13 then outputs a control signal to the halogen lamp 15 to emit the illumination light IL1. When the illumination light IL1 is emitted, the illumination light IL1 is guided into the alignment sensor 14 via the optical fiber 16, to pass through the condenser lens 20, and the illumination light IL1 is shaped by the field dividing stop 21 to thereby becomes the illumination light IL2. The illumination light IL2 passes through the object lens system 24, and after hang been reflected by the half mirror 25 and the mirror 26, passes through the object lens 27 and is reflected by the prism mirror 28, and irradiates and illuminates the wafer W.

The reflected light due to the illumination light IL2 returns to the alignment sensor 14 via the prism mirror 27, and after having passed through the object lens 27, is reflected by the mirror 26, passes through the half mirror 25, and reaches the beam splitter 30 via the lens system 29. Of the reflected light that has reached the beam splitter 30, the reflected light which has passed through the beam splitter 30 illuminates the index plate 31, and images of the index plate 31 and the alignment mark AM are formed in the state shown in FIG. 5. On the other hand, the reflected light reflected by the beam splitter 30 passes through the shielding plate 33 and enters into the line sensor 35, with the telecentric property thereof being destroyed by the pupil dividing mirror 34, and images of the slits 23a and 23b for detecting the focal point are formed on the light-receiving surface of the line sensor 35.

Referring to FIG. 5, the image pickup device 32 converts the image IM1 formed on the image pickup plane F1 into image information, while scanning in the scanning direction SC1, and output the convened image information to the alignment signal processing system 18 sequentially. When the image information is output to the alignment signal processing system 18, the image information is amplified by the AGC circuit (not shown) as described above, and digitized by the A/D converter, and stored in the image memory 40. Here, misalignment of the image information, particularly, a time lag at the time of being amplified by the AGC circuit becomes a problem. As described above, since the image pickup direction SC1 and the measuring direction of the image Im1 are set so as to be orthogonal to each other, the time lag in the scanning direction SC1 shown in FIG. 5, that is, the time lag in the longitudinal direction of the image Im1 of the alignment mark AM still occurs. However, since the measuring direction D11 is set to be orthogonal to the scanning direction SC1, a time lag in the measuring direction D11 does not occur.

Therefore, when the position information of the alignment mark AM is calculated by the position information calculation section 41, based on the image information stored in the image memory 40, since misalignment attributable to the time lag in the measuring direction D11 does not occur, the position information of the alignment mark can be measured with high accuracy. The defocus signal is output from the line sensor 35, and the focal position detection section 42 calculates the amount of defocus of the wafer W with respect to the focal position of the alignment sensor 14, based on this signal. The position information of the alignment mark AM obtained by the alignment signal processing section 18 and the amount of defocus detected by the focal position detection section 42 are output to the main control system 13 as the position information of the wafer.

By repeating the above processing, the measurement processing with respect to the alignment mark AM for measuring the position information in the Y-axis direction is performed. When tee measurement processing with respect to the alignment mark for measuring the position information in the X-axis direction is to be performed, the main control system 13 outputs a control signal to the alignment signal processing section 18, and the alignment signal processing section 18 rotates the image pickup device 32 based on this control signal. By rotating the image pickup device 32, the image pickup plane set at the time of performing the measurement processing of the alignment mark AM for measuring the position information in the Y-axis direction is rotated by 90 degrees. By setting in this manner, when the image of the alignment mark for measuring the position information in the X-axis direction is formed on the image pickup plane, the measuring direction of the alignment mark and the scanning direction of the image pickup device 32 becomes orthogonal to each other. The operation after the image pickup device 32 has been rotated is the same as the operation when the alignment mark for measuring the position information in the Y-axis direction is measured. The position information of the alignment mark measured in this manner does not include a time lag, and hence the position information of the alignment mark can be measured with high accuracy.

An example of the calculation mode in the position information calculation section 41 will be described, with reference to FIGS. 15A to 15C.

Figure 15A:
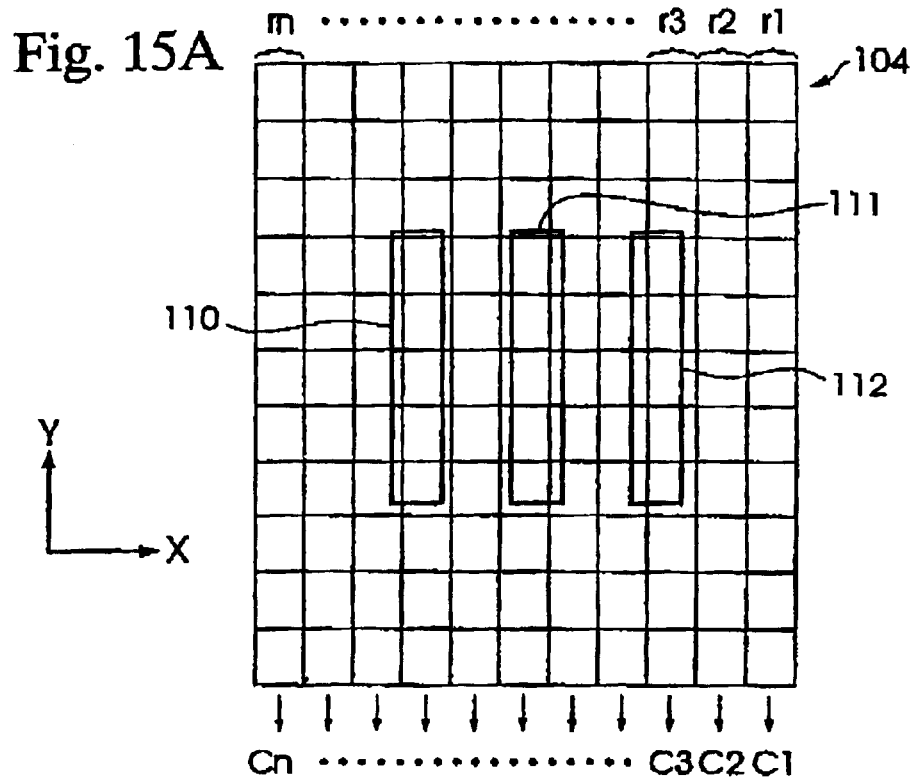
FIGS. 15A to 15C are diagrams for explaining an example a form of calculation in a position information calculation section 41.

FIG. 15A is a diagram showing the positional relationship between a mark and an image pickup device 32, when the position in the X-axis direction of the mark including line patterns (mark elements) 110, 111 and 112 arranged periodically in the X direction is to be measured by using the image pickup device 32. The scanning direction of the image pickup device is the direction of −Y axis in FIG. 15A, and the measuring direction of the mark is the direction of X axis, and both directions (scanning direction and measuring direction) are orthogonal to each other.

The image memory 40 stores the image information Cn obtained by scanning each row "ra" (n is a natural number), with respect to all pixels in the image pickup device 32. As the image information, a signal waveform as shown in FIG. 15B is stored for each row of the image pickup device 32. In FIG. 15A, the number of rows is decreased for illustration, and in FIG. 15B, of the obtained signal waveforms, only representative signal waveforms are shown.

The position information calculation section 41 performs the following processing based on the image information (signal waveform) stored in the image memory 40. At first, a mean value of signal waveforms (signal strengths) of a plurality of pixels existing in a predetermined area "a", as shown in FIGS. 15A and 15B, is calculated for each row. The calculated mean value (mean value of the signal strength for each row) is then plotted, by plotting the signal strength on the Y axis, and plotting the X position of the image pickup device in each row "rn" on the X axis. FIG. 15C shows an example plotted in this manner. The position information calculation section 41 calculates the position of the mark in the X-axis direction, by using for example a known edge detection method, based on the plotted waveform data (waveform in FIG. 15C).

Figure 15B:
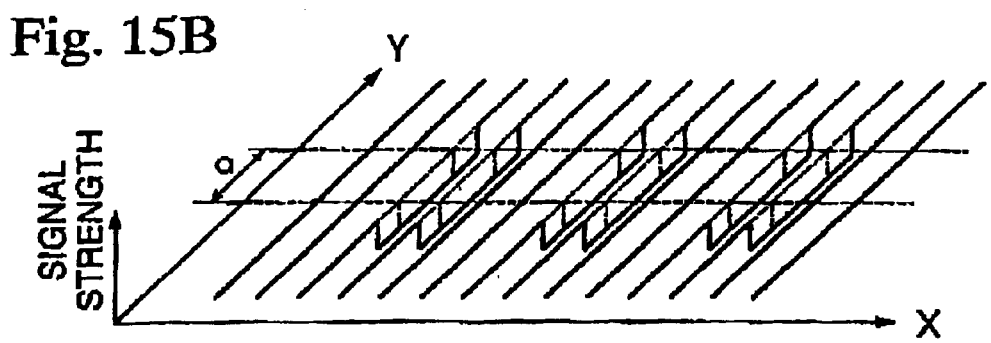
Figure 15C:
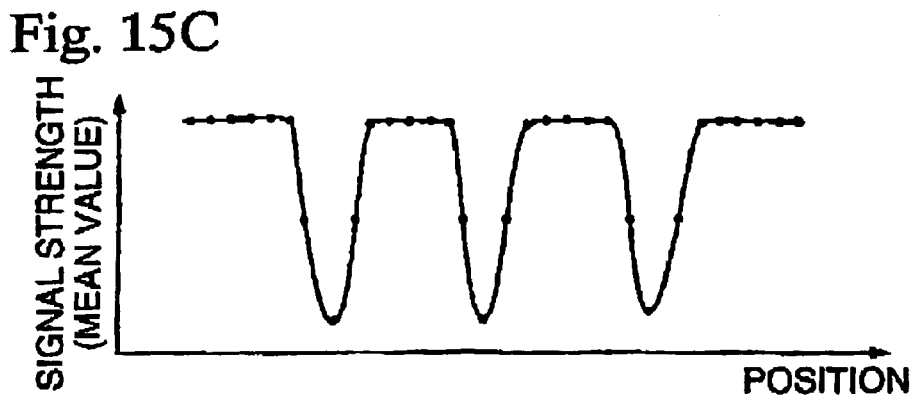

Misalignment of the image information Cn due to time lag (delay of the electric signal) occurs in the Y-axis direction in FIGS. 15A and 15B, and no misalignment occurs in the X-axis direction. Therefore, by using the above method, the occurrence of misalignment due to the delay of the electric signal (time lag) can be prevented.

When exposure processing is to be performed, the main control section 13 first corrects the position information included in the position information of the wafer output from the alignment signal processing section 18, by adding the above described baseline quantity thereto. The main control system 13 then drives the XY stage 9 via the stage drive system 12, based on the baseline-corrected X coordinate and Y coordinate of the wafer W, so that the center of each shot area coincides with the optical axis AX of the projection optical system PL. As a result, matching of each shot area of the wafer W with the accurate exposure position, that is, accurate alignment of the wafer W is carried out.

According to one embodiment of the present invention described above, since the measuring direction of the alignment mark and the scanning direction of the image pickup device 32 are set to be orthogonal to each other, for example, even when the image information is amplified by the AGC circuit, a time lag in the measuring direction does not occur as in the conventional apparatus, and hence misalignment attributable to time lag does not occur. Therefore, position information of the alignment mark can be measured with high accuracy. Moreover, alignment of the shot area of the wafer W and the exposure position is carried out, based on the position information detected with high accuracy. As a result, when exposure is performed repeatedly on the pattern already formed on the wafer W, superposition can be performed with high accuracy, and as a result, fine processing can be realized.

Next is a description of a position measuring apparatus according to an other embodiment of the present invention.

Figure 7:
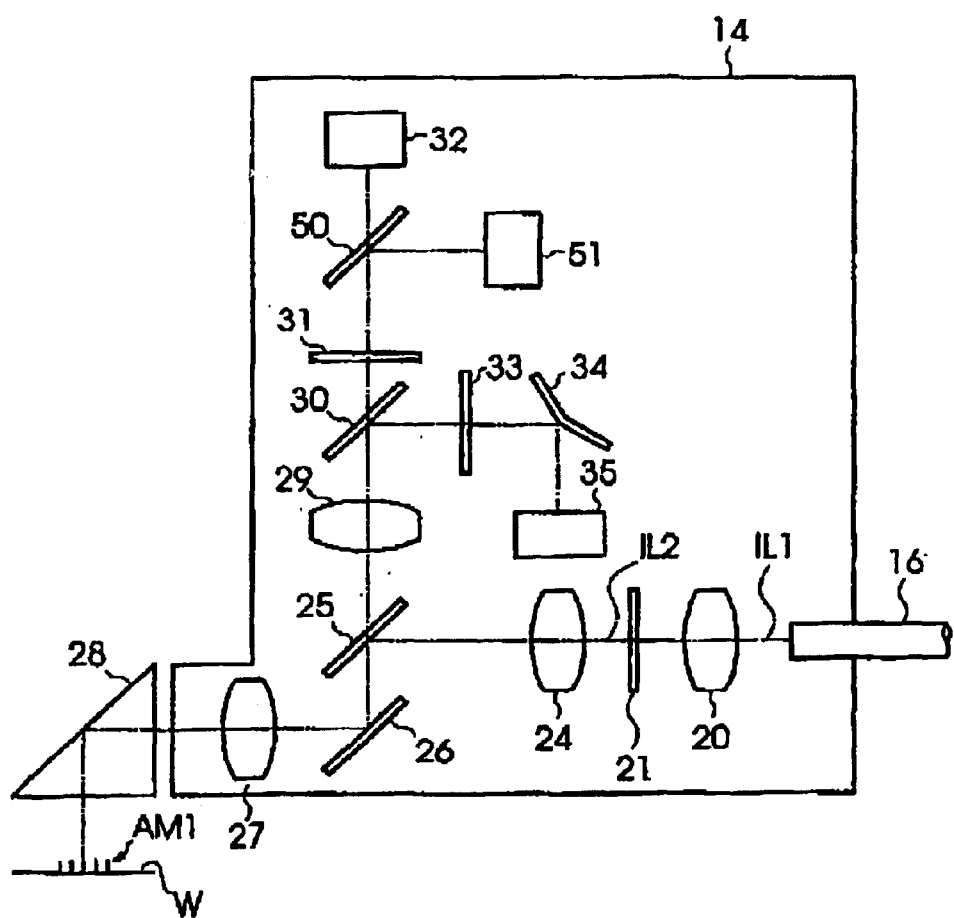
FIG. 7 is a diagram showing the construction of the alignment sensor 14 provided in a position measuring apparatus according to an other embodiment of the present invention.

FIG. 7 is a diagram showing the construction of the alignment sensor 14 provided in the position measuring apparatus according to this other embodiment of the present invention. In FIG. 7, members the same as those of the alignment sensor 14 shown in FIG. 2 are denoted by the same reference symbols, and explanation thereof is omitted. The point that is different between the alignment sensor 14 shown in FIG. 7, provided in the position measuring apparatus according to this other embodiment of the present invention, and the alignment sensor shown in FIG. 2, is that there is provided a beam splitter 50 which divides the image of an alignment mark AM1 which has passed through the index plate 31, and the image of the index plate 31 into two directions, and an image pickup device 51 which optically receives the images divided by the beam splitter 50.

Figure 8:
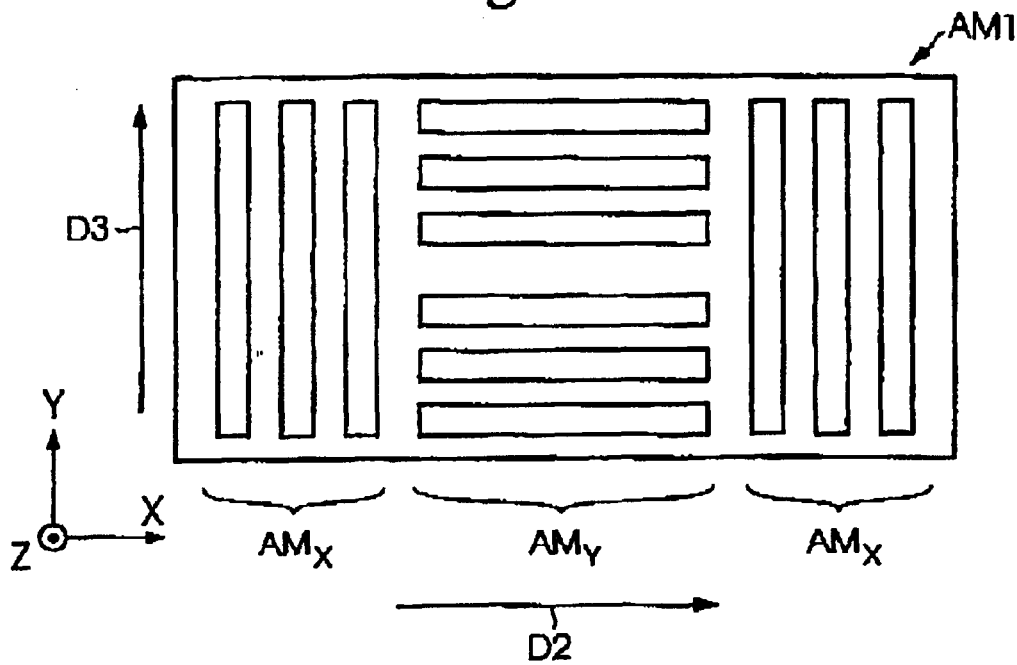
FIG. 8 is a top view of an alignment mark AM1 used in this embodiment.

The alignment mark AM1 will now be described. FIG. 8 is a top view of the alignment mark AM1 used in this embodiment. As shown in FIG. 8, the alignment mark AM1 used in this embodiment is for measuring the position information in the X-axis direction and the position information in the Y-axis direction by one measurement. This alignment mark comprises two mark elements $AM_X$ for measuring the position information in the X-axis direction, and a mark element $AM_Y$ for measuring the position information in the Y-axis direction. The measuring direction of the mark elements $AM_X$ is the direction indicated by reference symbol D2 in FIG. 8, and the measuring direction of the mark element $AM_Y$ is the direction indicated by reference symbol D3 in FIG. 8.

Figure 9:
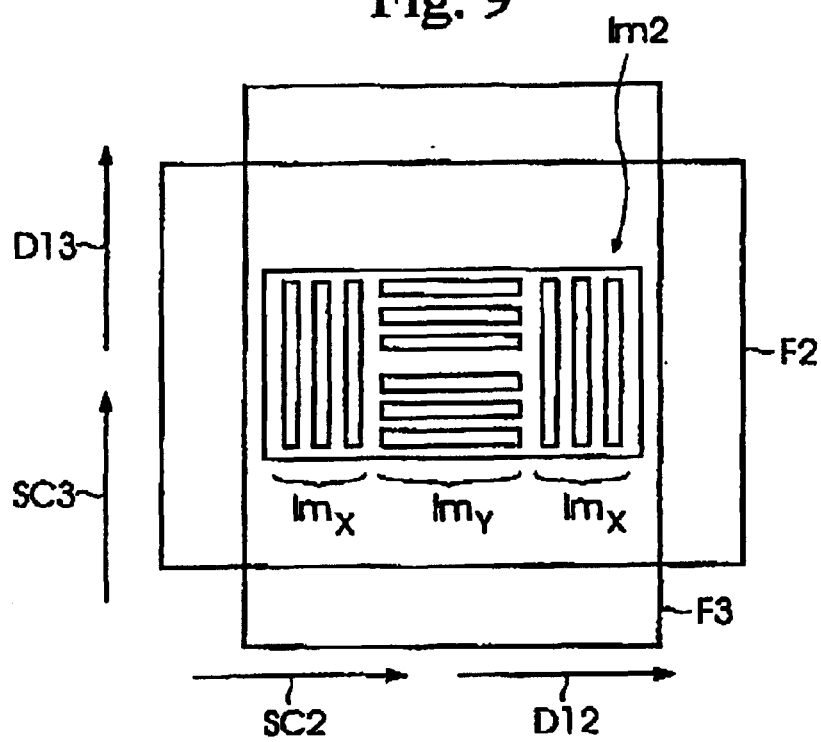
FIG. 9 is a diagram showing the arrangement on an image pickup plane F2 of an image pickup device 32 and an image pickup plane F3 of an image pickup device 51, with respect to the image of the alignment mark AM1.

Next is a description of the positional relationship between the image pickup device 32, the scanning direction of the image pickup device 51 and the image of the alignment mark AM1. FIG. 9 is a diagram showing the positional relationship of an image pickup plane F2 of the image pickup device 32 and an image pickup plane F3 of the image pickup device 51, with respect to the image of the alignment mark AM1. The image Im2 of the alignment mark AM1 formed on the image pickup plane F2 of the image pickup device 32 and the image pickup plane F3 of the image pickup device 51 is arranged substantially in the middle of the image pickup plane F2 and the image pickup plane F3. In FIG. 9, reference symbols $Im_X$ are given to the images of the mark elements $AM_X$, and reference symbol $Im_Y$ is given to the image of the mark element $AM_Y$. The measuring direction of the images of the mark elements $AM_X$ is the direction denoted by reference symbol D12, and the measuring direction of the image of the mark element $AM_Y$ is the direction denoted by reference symbol D13. In FIG. 9, the direction denoted by reference symbol SC2 is the scanning direction of the image pickup device 32, and the direction denoted by reference symbol SC3 is the scanning direction of the image pickup device 51.

Figure 10:
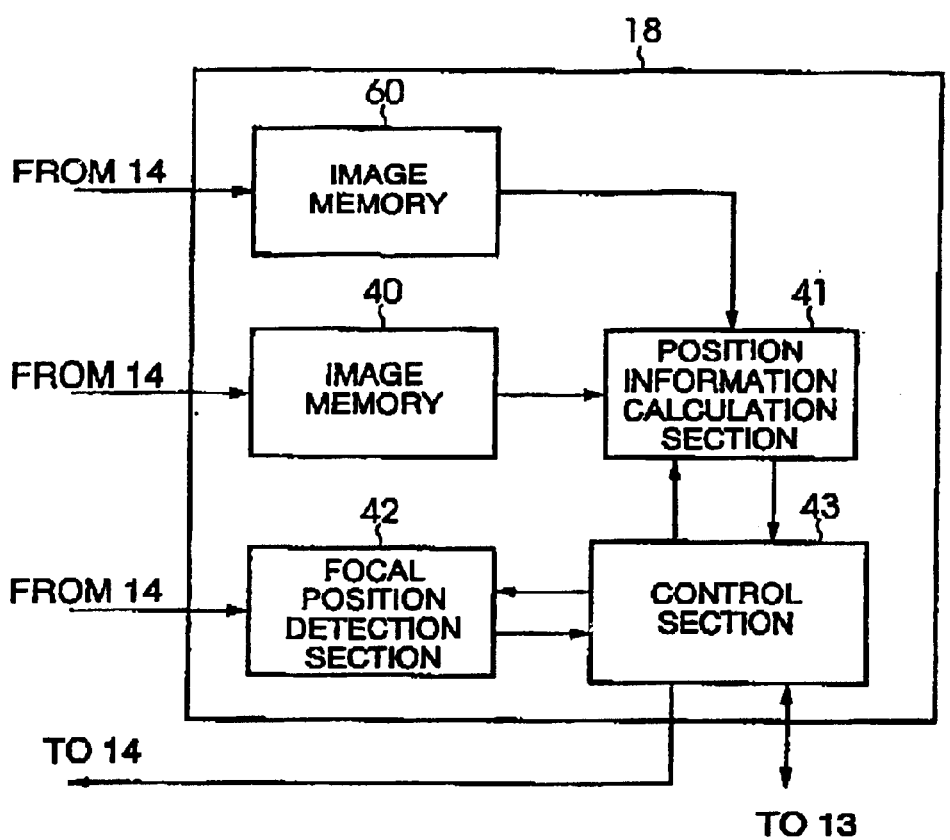
FIG. 10 is a block diagram showing the internal structure of the alignment signal processing system 18, when the alignment sensor 14 is the one shown in FIG. 9.

FIG. 10 is a block diagram showing the internal structure of the alignment signal processing system 18 for when the alignment sensor 14 is the one shown in FIG. 9. The point that is different between the alignment signal processing section 18 shown in FIG. 10 and the alignment signal processing section 18 shown in FIG. 6 is that an image memory 60 is further provided. This is because the image pickup device 51 is provided inside the alignment sensor 14. That is to say, the image information output from the image pickup device 32 is stored in the image memory 40, and the image information output from the image pickup device 51 is stored in the image memory 60. The position information calculation section 41 obtains the position information in the X-axis direction and the position information in the Y-axis direction of the alignment mark AM1 by calculation, using the same method as the above described method, based on the image information stored in the image memory 40 and the image memory 60. Though not shown, the AGC circuit and the A/D converter are provided in the previous stage of the image memory 60.

Next is a description of the operation of the position measuring apparatus according to the other embodiment of the present invention.

When the processing is started, the main control system 13 controls the XY stage 9 via the stage drive system 12, so that the alignment mark AM1 to be measured is shifted to a position within the area of visual field of the alignment sensor 14. The main control system 13 then outputs a control signal to the halogen lamp 15 so as to emit the illumination light IL1, so that the alignment mark AM1 is irradiated and illuminated by the illumination light IL2, to thereby form the image Im2 on the image pickup plane F2 of the image pick-up device 32 and on the image pickup plane F3 of the image pickup device 51.

The image pickup device 32 converts the image Im2 formed on the image pickup plane F2 into an electric signal, while scanning in the scanning direction SC2, and outputs the electric signal as image information. The image pickup device 51 also converts the image Im2 formed on the image pickup plane F3 into an electric signal, while scanning in the scanning direction SC3, and outputs the electric signal as image information. The image signals output from the image pickup device 32 and the image pickup device 51 are amplified by the AGC circuit (not shown), digitized by the A/D converter, and stored in the image memory 40 and the image memory 60, respectively.

Here, misalignment of the image information, particularly, a time lag at the time of being amplified by the AGC circuit becomes a problem. As described above, in the image pickup plane F2 of the image pickup device 32, since the scanning direction SC2, and the measuring direction D13 of the image ImY of the mark element $AM_Y$ are set so as to be orthogonal to each other, the time lag in the scanning direction SC2 shown in FIG. 9, that is, the time lag in the longitudinal direction of the image ImY of the mark element $AM_Y$ still occurs. However, since the measuring direction D13 is set to be orthogonal to the scanning direction SC2, a time lag in the measuring direction D13 does not occur. Therefore, when the image Im2 of the alignment AM1 is formed on the image pickup plane F2 of the image pickup device 32 in the state shown in FIG. 9, if measurement is carried out by using only the image information in the portion of the image ImY of the mark element $AM_Y$, of the image information stored in the image memory 40, misalignment attributable to the time lag in the measuring direction D13 at the time of calculating the position information in the measuring direction D13, that is, in the Y-axis direction of the alignment mark AM1, does not occur. Hence, the position information in the Y-axis direction of the alignment mark AM can be measured with high accuracy.

In the image pickup plane F3 of the image pickup device 51, as described above, since the scanning direction SC3, and the measuring direction D12 of the images $Im_X$ of the mark elements $AM_X$ are set so as to be orthogonal to each other, the time lag in the scanning direction SC3 shown in FIG. 9, that is, the time lag in the longitudinal direction of the images $Im_X$ of the mark elements $AM_X$ of the alignment mark AM still occurs. However, since the measuring direction D12 is set to be orthogonal to the scanning direction SC3, a time lag in the mea direction D12 does not occur. Therefore, when the image Im2 of the alignment AM1 is formed on the image pickup plane F3 of the image pickup device 51 in the state shown in FIG. 9, if measurement is carried out by using only the image information in the portions of the images $Im_X$ of the mark elements $AM_X$, of the image information stored in the image memory 60, misalignment attributable to the time lag in the measuring direction D12 at the time of calculating the position information in the measuring direction D12, that is, in the X-axis direction of the alignment mark AM1 does not occur. Hence, the position information in the X-axis direction of the alignment mark AM can be measured with high accuracy.

As described above, in this embodiment, the position information in the X-axis direction and in the Y-axis direction of the alignment mark AM1 can be measured by only one measurement of the alignment mark AM1. Hence, it is not necessary to rotate the image pickup device as in the above described embodiment. Therefore, this is preferable in view of improving throughput, that is, the number of wafers which can be processed in a unit time. The position information in the X-axis direction and the position information in the Y-axis direction calculated by the position information calculation section 41, and the defocus quantity detected by the focal position detection section 42 are output to the main control system 13 as the position information of the wafer.

When exposure processing is to be performed, the main control system 13 first corrects the position information in the X-axis direction and the position information in the Y-axis direction included in the position information of the wafer output from the alignment signal processing section 18, by adding the above described baseline quantity thereto. The main control system 13 then drives the XY stage 9 via the stage drive system 12, based on the baseline-corrected X coordinate and Y coordinate of the wafer W, so that the center of each shot area coincides with the optical axis AX of the projection optical system PL. As a result, matching of each shot area of the wafer W with the accurate exposure position, that is, accurate alignment of the wafer W is carried out.

According to the position measuring apparatus for the other embodiment described above, an alignment mark having mark elements $AM_X$, $AM_X$ and $AM_Y$ with the measuring directions D2 and D3 set orthogonal to each other, is used as the alignment mark AM1 for measuring the position information, and the image $Im_2$ of the alignment mark AM1 is picked up by the image pickup devices 32 and 51 which are arranged in a relationship with the directions SC2 and SC3 thereof orthogonal to each other. The position information is measured by using only the image information of the portion where the measuring direction is orthogonal to the scanning direction, of the image information converted by the image pickup devices 32 and 51. Therefore, for example, even if the image information is amplified by the AGC circuit, a time lag does not occur in the measuring direction as in the conventional apparatus, and hence misalignment attributable to time lag does not occur. As a result, the position information of the alignment mark can be measured with high accuracy. Moreover, alignment of the shot area of the wafer W with the exposure position is carried out based on the position information detected with high accuracy. Therefore, when exposure is performed repeatedly on a pattern already formed on the wafer W, superposition can be performed with high accuracy, and as a result, fine processing can be realized.

In the above described embodiment, the occurrence of misalignment attributable to a delay of the electric signal (time lag) is prevented by acting the scanning direction of the image pickup device in the direction orthogonal to the measuring direction of the mark. However, there is also au other measuring method which prevents the occurrence of misalignment attributable to a delay of the electric signal. The other measuring method will be described below.

Figure 13:
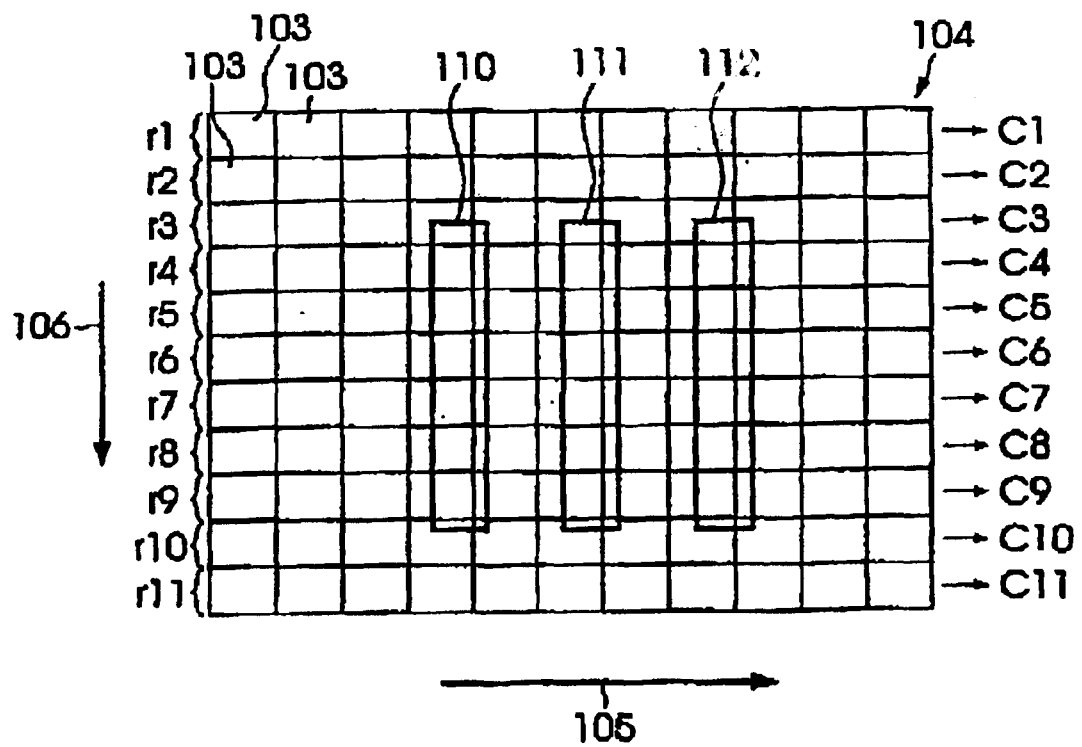
FIG. 13 is a diagram for explaining position information measurement processing by an FIA type alignment sensor.
Figure 14:
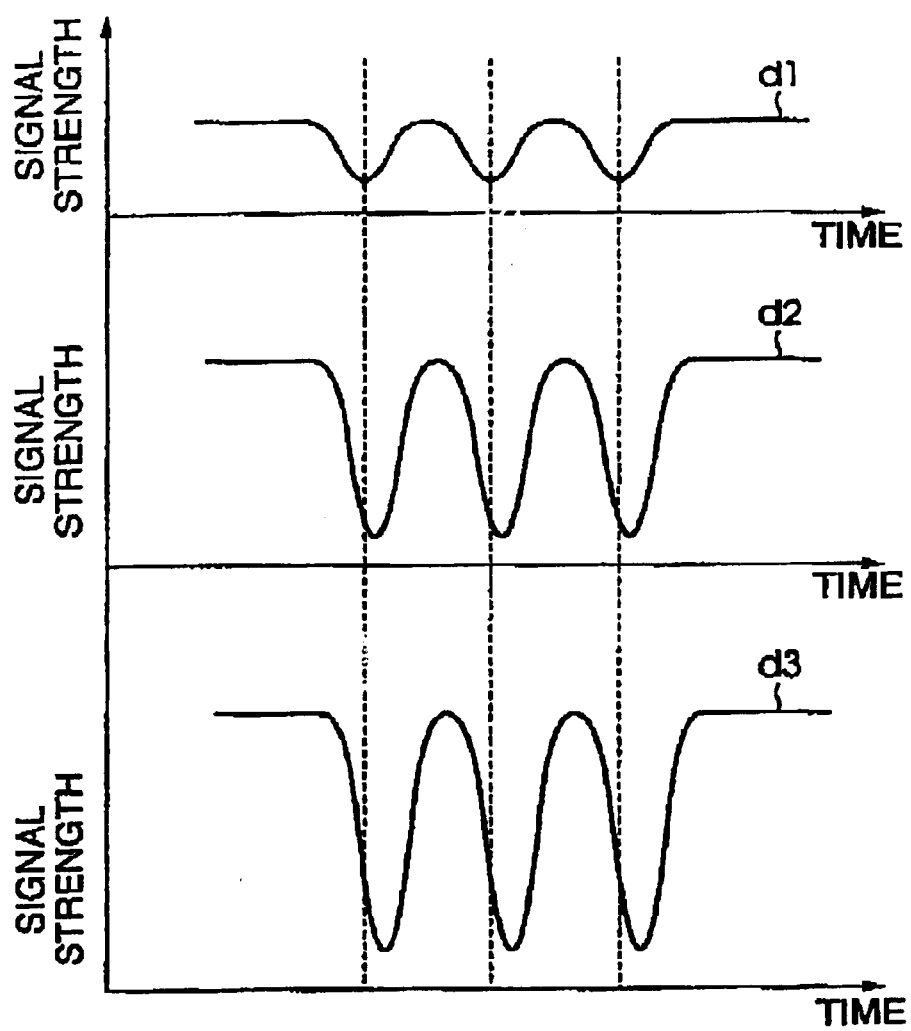
FIG. 14 is a diagram showing an example of results of amplifying image information, obtained by converting images 110, 111 and 112 of mark elements shown in FIG. 13 by the image pickup device, at different amplification factors.

At first, the image of the mark is picked up in a state with the scanning direction of the image pickup device set in the same direction as the measuring direction of the mark (with the image pickup device being at 0 degree with respect to the mark), as shown in FIG. 13, to obtain the image information (normal image information, first image information), and then the position information of the mark (first mark position information) is obtained based on the image information. The image pickup device is then rotated by 180 degrees and the image of the mark picked up, to obtain the image information thereof (inverted image information, second image information), and the position information of the mark (second mark position information) is then obtained based on the image information. Then, a mean value of the first and second mark position information is obtained. In this manner, by taking an average between the position information of the mark obtained in the state with the scanning direction of the image pickup device being at 0 degree with respect to the measuring direction of the mark and the position information of the mark obtained by inverting the image pickup device by 180 degrees, misalignment of the mark signal attributable to a time lag of the electric signal can be compensated. As a result, it becomes possible to measure a mark position which does not include misalignment due to time lag.

As another method, here can be considered a method using an image pickup device that can read out interlace. As shown in FIG. 13, an image pickup device is arranged in a state with the scanning direction of the image pickup device set in the same direction of the measuring direction of the mark (with the image pickup device being at 0 degree with respect to the mark). The image pickup device and a scanning algorithm are configured such that, for example, at the time of scanning pixels in odd lines, scanning can be formed in the normal scanning direction (in FIG. 13, the scanning direction 105), and at the time of scanning pixels in even lines, scanning can be performed in a scanning direction opposite to the normal scanning direction (in FIG. 13, in the opposite direction to the scanning direction 105). Accordingly, as in the above described measuring method, by taking the average between the position information of the mark obtained in the state with the scanning direction of the image pickup device being at 0 degree with respect to the measuring direction of the mark and the position information of the mark obtained by inverting the image pickup device by 180 degrees, misalignment of the mark signal attributable to a time lag of the electric signal can be compensated. As a result, it becomes possible to measure a mark position which does not include misalignment due to time lag.

In the above described embodiment, description has been made for where the image pickup device 32 is rotated, but the present invention is not limited thereto. For example, the image pickup device may be fixed, and the mark image formed on the surface of the image pickup device may be rotated by rotating (by 90 degrees or 180 degrees) a rotatable optical member arranged in the optical path from the mark to the image pickup device.

The exposure apparatus (FIG. 1) according to the one embodiment of the present invention described above is manufactured by assembling and coupling electrically, mechanically or optically, each component shown in FIG. 1, such as the illumination optical system 1, the reticle alignment system including the reticle holder 3, the base 4 and the drive 5, the wafer alignment system including the wafer holder 7, the Z stage 8, the XY stage 9, the movable mirror 10 and the laser interferometer 11, and the projection optical system PL, and then performing integrated adjustment (electrical adjustment, operation checking, etc.) so that position control of the wafer W can be performed accurately and at a high speed, and exposure becomes possible with high exposure accuracy, while improving the throughput.

Next is a description of the manufacture of devices using the exposure apparatus and exposure method according to the one embodiment of the present invention.

Figure 11:
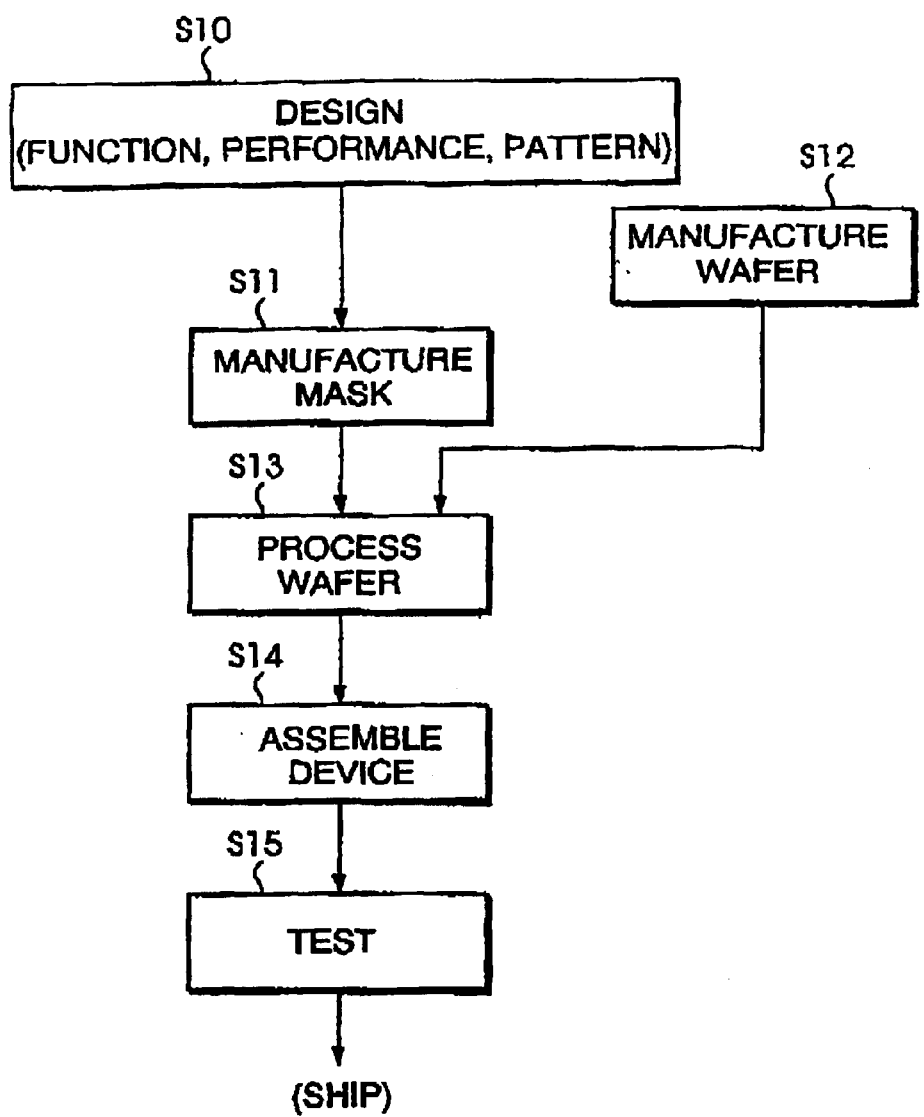
FIG. 11 is a flowchart for when devices are manufactured using the exposure apparatus according to one embodiment of the present invention.
Figure 12:
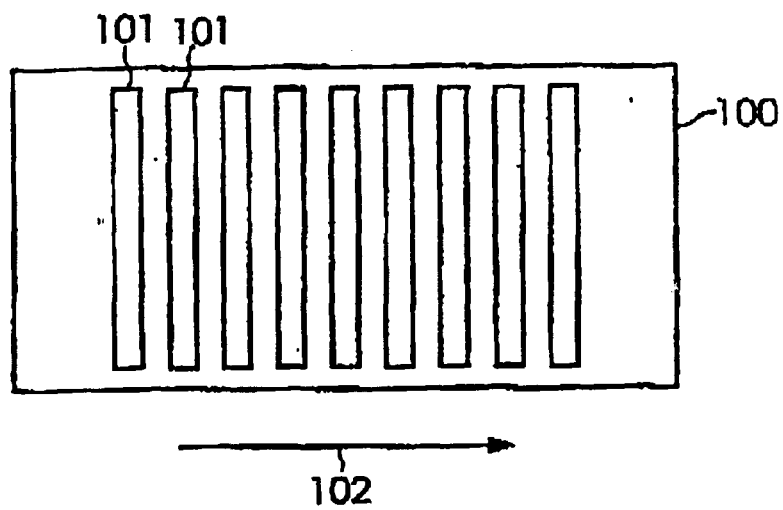
FIG. 12 is a diagram showing one example of a mark formed on a substrate for position measurement.

FIG. 11 is a flowchart for production of devices (semiconductor chips such as IC and LSI, liquid crystal panels, CCDs, thin film magnetic heads, micromachines, etc.) using the exposure apparatus according to the one embodiment of the present invention. As shown in FIG. 11, at first in step S10 (design step), functional design of the device (for example, circuit design or the like of the semiconductor device) is performed, and pattern design for realizing the function is performed. Subsequently, in step S11 (mask production step), a mask on which the designed circuit pattern is formed is produced. On the other hand, in step S12 (wafer manufacturing step), wafers are manufactured using materials such as silicon.

Then, in step S13 (wafer processing step), an actual circuit or the like is formed on the wafer by a lithographic technique, using the mask and the wafer prepared in step S10 to step S12. In step S14 (assembly step), the wafer processed in step S13 is formed into a chip. This step S14 includes steps such as an assembly step (dicing, bonding), and a packaging step (chip mounting). Lastly, in step S15 (inspection step), inspections such as operation confirmation tests of the device, durability tests and the like of the devices manufactured in step S15 are carried out. The devices are then completed after passing through these steps, and shipped.

The exposure apparatus in this embodiment is also applicable to a scanning type exposure apparatus (U.S. Pat. No. 5,473,410) wherein a mask pattern is exposed, while the mask and a substrate are synchronously moved. Moreover, the exposure apparatus in this embodiment is also applicable to a proximity exposure apparatus wherein a mask pattern is exposed by bringing a mask and a substrate into close contact with each other, without using the projection optical system. The application of the exposure apparatus is not limited to the exposure apparatus for manufacturing semiconductors, and for example, the exposure apparatus is widely applicable to exposure apparatus for liquid crystals, wherein a pattern of a liquid crystal display device is exposed on a rectangular glass plate, or exposure apparatus for manufacturing thin film magnetic beads. For the light source for the exposure apparatus in this embodiment, not only a g line (436 nm), an i line (365 nm), a KrF excimer laser beam (248 nm), an ArF excimer laser beam (193 nm) or an $F_2$ excimer laser beam (157 nm), but also an X-ray or charged particle beams such as electron beams may be used. For example, when the electron beam is used, thermionic emission type lanthanum hexaboride ($LaB_6$) and tantalum (Ta) may be used as an electron gun.

The magnification of the projection optical system may involve not only a reduction system but may also involve an equal magnification or enlarging system. As the projection optical system, when a far-ultraviolet ray such as an excimer laser is used, a material which nits the far-ultraviolet ray, such as quart or fluorite, is used as the glass material, and when an $F_2$ laser or X-ray is used, a reflection/refraction system or a refraction system is used as the optical system (also for the reticle, one of a reflection type is used), or when an electron beam is used, an electronic optical system consisting of an electron lens and a deflector may be used as the optical system. Here, needless to say, the optical path along which the electron beam passes is evacuated.

When a linear motor is used for the wafer stage and the reticle stage (see U.S. Pat. No. 5,623,853 or U.S. Pat. No. 5,528,118), either of an air floating type using an air bearing or a magnetic floating type using Lorentz force or reactance force may be used. Moreover, the respective stages may be of a type which moves along a guide, or a guideless type without a guide. As the drive for the respective stages, a planar motor may be used wherein a magnetic unit in which magnets are arranged two-dimensionally and an armature unit in which coils are arranged two-dimensionally are made to face each other, and respective stages are driven by an electromagnetic force. In this case, either the magnetic unit or the armature unit is connected to the stages, and the other of the magnetic unit and the armature unit may be provided on the moving plane side of the stages.

The reaction force generated by the movement of the wafer stage may be removed mechanically to the floor (ground) using a frame member, as described in Japanese Unexamined Patent Application, First Publication No. Hei 8-166475 (U.S. Pat. No. 5,528,118). The reaction force generated by the movement of the reticle stage may be removed mechanically to the floor (ground) using a frame member, as described in Japanese Unexamined Patent Application, First Publication No. Hei 8-330224 (U.S. Ser. No. 08/416,558).

What is claimed is:

1. A position measuring apparatus which measures position information in a predetermined direction of a mark formed on an object, comprising:

an irradiation device which irradiates a detection beam onto the mark;

an imaging optical system which forms an image of the mark generated by the mark due to the irradiation of the detection beam, on an image plane;

an image pickup device which picks up the image of the mark on the image plane, while scanning a plurality of scanning lines, to generate image information corresponding to the image of the mark; and a calculation device, which is electrically connected to said image pickup device, and which obtains position information in the predetermined direction of the mark, based on the image information, wherein the scanning direction of a scanning line included in the scanning lines which is used for measurement of position information in the predetermined direction of the mark is orthogonal to the predetermined direction.

2. A position measuring apparatus according to claim 1, further comprising a memory device which stores the image information, and wherein the calculation device calculates image information of the mark, based on the image information stored in the memory device.

3. A position measuring apparatus according to claim 1, wherein the image pickup device is rotatable with respect to the image of the mark, so that the direction of the scanning lines is orthogonal to the predetermined direction.

4. A position measuring apparatus according claim 1, wherein the mark includes a first mark having periodicity in a first direction, and a second mark having periodicity in a second direction orthogonal to the first direction, and the image pickup device includes a first image pickup device comprising scanning lines extending in a direction orthogonal to the first direction, and a second image pickup device comprising scanning lines extending in a direction orthogonal to the second direction.

5. A position measuring apparatus according to claim 4, wherein the calculation device obtains position information of the first mark in the first direction, based on the image information obtained by the first image pickup device, and obtains position information of the second mark in the second direction, based on the image information obtained by the second image pickup device.

6. A position measuring apparatus according to claim 5, further comprising:

a branching device which branches the image of the mark to an image of the first mark and an image of the second mark, and guides the image of the first mark to the first image pickup device, and guides the image of the second mark to the second image pickup device;

a first memory device which stores the image information obtained from the first image pickup device; and a second memory device which stores the image information obtained from the second image pickup device.

7. A position measuring apparatus which measures position information in a predetermined direction of a mark formed on an object, comprising:

an irradiation device which irradiates a detection beam onto the mark;

an imaging optical system which forms an image of the mark generated from the mark due to the irradiation of the detection beam, on an image plane;

an image pickup device which picks up the image of the mark on the image plane, while scanning scanning lines, to generate image information corresponding to the image of the mark; and a calculation device, which is electrically connected to said image pickup device, and which obtains position information in the predetermined direction of the mark, based on the image information, an inversion device which inverts the relation between the scanning direction of all scanning lines of the image pickup device and the direction of the image of the mark on the image plane, wherein the image pickup device picks up the image of the mark, under a condition before an inversion operation is performed by the inversion device, to generate first image information, and picks up the image of the mark, under a condition after the inversion operation is performed by the inversion device, to generate second image information, and the calculation device obtains the position information based on the first and second image information.

8. A position measuring apparatus according to claim 7, wherein the inversion device rotates the image pickup device with respect to an image of the mark, or rotates the image of the mark with respect to the image pickup device.

9. A position measuring apparatus according to claim 8, wherein the calculation device calculates an average between first position information obtained based on the first image information and second position information obtained based on the second image information, to obtain the position information of the mark.

10. A position measuring apparatus according to claim 1, wherein the calculation device obtains a signal strength distribution based on position information in the predetermined direction of each of the scanning lines and signal strength obtained for each of the scanning lines, and calculates position information in the predetermined direction of the mark based on the signal strength distribution.

11. A position measuring method for measuring position information in a predetermined direction of a mark formed on an object, comprising:

irradiating a detection beam onto the mark;

forming an image of the mark generated by the mark due to the irradiation of the detection beam, on an image plane;

picking up the image of the mark on the image plane, by using from a plurality of scanning lines, a scanning line which is used for measurement of position information in the predetermined direction of the mark and which scans in a direction orthogonal to the predetermined direction, to generate image information corresponding to the image of the mark; and obtaining the position information in the predetermined direction of the mark, based on the image information.

12. A position measuring method for measuring position information in a predetermined direction of a mark formed on an object, comprising:

an irradiation step of irradiating a detection beam onto the mark;

an image pickup step of forming an image of the mark generated by the mark due to the irradiation of the detection beam, on an image plane in an image pickup device, and picking up the image of the mark on the image plane, while scanning a plurality of scanning lines, to generate image information corresponding to the image of the mark;

a calculation step of obtaining the position information in the predetermined direction of the mark, based on the image information; and an inversion step of inverting the relation between the scanning direction of all scanning lines of the image pickup device and the direction of the image of the mark on the image plane, wherein in the image pickup step, the image of the mark is picked up in the condition before the inversion operation is performed by the inversion step, to generate first image information, and the image of the mark is picked up in the condition after the inversion operation has been performed by the inversion step, to generate second image information, and in the calculation step, the position information is obtained based on the first and second image information.

13. A position measuring method according to claim 12, wherein in the inversion step, the image pickup device is rotated with respect to the image of the mark, or the image of the mark is rotated with respect to the image pickup device, and in the calculation step, a mean value between first position information obtained based on the first image information and second position information obtained based on the second image information is calculated to thereby obtain the position information of the mark.

14. A position measuring method according to claim 11, wherein a signal strength distribution is obtained based on position information in the predetermined direction of each of the scanning lines and signal strength obtained for each of the scanning lines, and position information in the predetermined direction of the mark is obtained based on the signal strength distribution.

15. An exposure apparatus in which a pattern formed on a mask is illuminated, and the image of the pattern is transferred onto a substrate on which the mark is formed, comprising:

a position measuring apparatus according to claim 1; and an alignment device which performs relative alignment between the substrate and the mask based on the position information of the mark measured by the position measuring apparatus, wherein the substrate aligned by the alignment device is exposed with the pattern.

16. An exposure apparatus in which a pattern formed on a mask is illuminated, and the image of the pattern is transferred onto a substrate on which the mark is formed, comprising:

a position measuring apparatus according to claim 7; and an alignment device which performs relative alignment between the substrate and the mask, based on the position information of the mark measured by the position measuring apparatus, wherein the substrate aligned by the alignment device is exposed with the pattern.

17. An exposure method in which a pattern formed on a mask is illuminated, and the image of the pattern is transferred onto a substrate on which the mark is formed, comprising:

performing relative alignment between the substrate and the mask, based on the position information of the mark measured by a position measuring method according to claim 11; and exposing the aligned substrate with the pattern.

18. An exposure method in which a pattern formed on a mask is illuminated, and the image of the pattern is transferred onto a substrate on which the mark is formed, comprising:

performing relative alignment between the substrate and the mask, based on the position information of the mark measured by a position measuring method according to claim 12; and exposing the aligned substrate with the pattern.

19. A device manufacturing method using the exposure method according to claim 17.

20. A device manufacturing method using the exposure method according to claim 18.

* * * * *